(12) United States Patent
Hu

(10) Patent No.: US 10,269,830 B1
(45) Date of Patent: Apr. 23, 2019

(54) FLEXIBLE ARRAY SUBSTRATE AND MANUFACTURING METHOD THEREOF

(71) Applicant: Wuhan China Star Optoelectronics Semiconductor Display Technology Co., Ltd., Wuhan, Hubei (CN)

(72) Inventor: Junyan Hu, Wuhan (CN)

(73) Assignee: WUHAN CHINA STAR OPTOELECTRONICS SEMICONDUCTOR DISPLAY TECHNOLOGY CO., LTD. (CN)

( * ) Notice: Subject to any disclaimer, the term of this patent is extended or adjusted under 35 U.S.C. 154(b) by 0 days.

(21) Appl. No.: 15/741,823

(22) PCT Filed: Dec. 28, 2017

(86) PCT No.: PCT/CN2017/119407
§ 371 (c)(1),
(2) Date: Jan. 4, 2018

(30) Foreign Application Priority Data

Nov. 27, 2017 (CN) .......................... 2017 1 1201264

(51) Int. Cl.
| | |
|---|---|
| H01L 27/12 | (2006.01) |
| H01L 21/3213 | (2006.01) |
| H01L 21/027 | (2006.01) |
| H01L 29/49 | (2006.01) |
| H01L 21/02 | (2006.01) |
| H01L 29/51 | (2006.01) |
| H01L 21/285 | (2006.01) |

(52) U.S. Cl.
CPC ...... *H01L 27/1218* (2013.01); *H01L 21/0273* (2013.01); *H01L 21/32139* (2013.01); *H01L 27/124* (2013.01); *H01L 27/1248* (2013.01); *H01L 27/1262* (2013.01); *H01L 27/1288* (2013.01); *H01L 21/0217* (2013.01); *H01L 21/28568* (2013.01); *H01L 29/4908* (2013.01); *H01L 29/518* (2013.01)

(58) Field of Classification Search
None
See application file for complete search history.

(56) References Cited

U.S. PATENT DOCUMENTS

| | | | | |
|---|---|---|---|---|
| 7,858,411 | B2* | 12/2010 | Yamazaki | ......... G02F 1/133305 438/30 |
| 2005/0056842 | A1* | 3/2005 | Nishi | .................. H01L 27/1214 257/66 |
| 2010/0224872 | A1* | 9/2010 | Kimura | ............... H01L 27/1214 257/43 |
| 2011/0120755 | A1* | 5/2011 | Lee | ..................... H01L 27/1214 174/254 |
| 2015/0349294 | A1* | 12/2015 | Lee | ..................... H01L 51/5246 257/40 |
| 2017/0170206 | A1* | 6/2017 | Lee | ..................... H01L 27/1218 |
| 2017/0194409 | A1* | 7/2017 | Jeong | .................. H01L 27/1218 |

* cited by examiner

*Primary Examiner* — Bilkis Jahan
(74) *Attorney, Agent, or Firm* — Emerson, Thomson & Bennett LLC; Roger D. Emerson

(57) ABSTRACT

A flexible array substrate and a manufacturing method thereof are provided. The array substrate includes a glass substrate, a flexible base substrate, a buffer layer, an active layer, a gate insulating layer, a first metal layer, an interlayer insulating layer, a flexible organic layer, a second metal layer and a passivation layer. The flexible organic layer includes at least two first via holes, and the first via holes sequentially pass through the interlayer insulating layer, the gate insulating layer and the buffer layer.

13 Claims, 4 Drawing Sheets

FLEXIBLE ARRAY SUBSTRATE AND MANUFACTURING METHOD THEREOF

FIELD OF THE INVENTION

The present disclosure relates to the field of display panel manufacturing, and in particular, to a flexible array substrate and a manufacturing method thereof.

BACKGROUND OF DISCLOSURE

With continuous development of display technology, researchers have developed flexible display apparatuses which are foldable or rollable. Compared with conventional rigid display apparatuses (that is, display apparatuses fabricated on unbendable substrates, such as glass), the flexible display apparatuses have many advantages, such as light weight, small size, easy carry, high impact resistance, and strong anti-vibration performance. With continuous development of display technology, flexible display apparatuses have been increasingly used in the fields of curved displays and wearable displays, due to their own bendable and foldable characteristics. Therefore, flexible display apparatuses have also attracted attentions in the display field in recent years.

A flexible display panel, also known as a rollable display, is a visual flexible panel made by flexible materials for constructing a bendable, deformable display apparatus. Flexible display panels are one of the popular trends in display technology. Although flexible display panels are not yet widely popularized on the market, it is foreseeable that rollable PDAs or e-book readers are no longer far away, and flexible display panels having a large area for hanging on a wall will soon become a reality. For example, all visual materials, including a variety of books, newspapers, magazines, and video files, can be rendered on these displays and viewed anywhere and anytime. Flexible electronic displays have unparalleled advantages, like newspapers, can be expanded in need, and curled or even folded after use, so as to achieve both easy carry and visual effects.

Flexible displays have become a current trend in displays, and have advantage, such as small sizes, decent plasticity, easy carry, and flexible forms. However, many problems need to be overcome to achieve bendable flexible display apparatuses. When a flexible display is bent, and a radius of curvature is sufficiently small, stress on an inorganic layer becomes greater, and can not be effectively released. In severe cases, irreparable damages may be caused to the layers, and have a great impact on the displays. There is a need to find a reliable method for releasing the stress in time.

SUMMARY OF INVENTION

A primary object of the present disclosure is to provide a flexible array substrate and a manufacturing method thereof to solve the problem that when a flexible display apparatus is bent, stress on an inorganic layer of a flexible display apparatus becomes greater, and can not be effectively released, thereby affecting display of the flexible display apparatus.

In order to solve the above problem, the technical solution provided by the present disclosure is as follows:

The present invention provides a flexible array substrate, including:

a glass substrate;

a flexible base substrate formed on a surface of the glass substrate;

a buffer layer formed on a surface of the flexible base substrate;

an active layer formed on a surface of the buffer layer;

a gate insulating layer formed on a surface of the active layer, and covering the active layer and the buffer layer;

a first metal layer formed on a surface of the gate insulating layer, and patterned to form a gate and a gate line of a thin film transistor;

an interlayer insulating layer formed on a surface of the first metal layer, and covering the first metal layer and the gate insulating layer;

a flexible organic layer formed on a surface of the interlayer insulating layer;

a second metal layer formed on a surface of the flexible organic layer, and patterned to form a source and a drain, wherein the source includes a second via hole, and the drain includes a third via hole; and a passivation layer formed on a surface of the second metal layer;

wherein the flexible array substrate further includes at least two first via holes, and filler material of the first via holes is same as material of the flexible organic layer.

In a preferred embodiment of the present disclosure, the flexible organic layer is formed by patterning a flexible organic material deposited on a surface of the interlayer insulating layer, and retaining at least a portion of the patterned flexible organic material;

the source and the drain are formed by patterning a second metal layer deposited on a surface of the interlayer insulating layer, and retaining at least a portion of the patterned second metal layer; and the source and the drain are located on a same layer structure as the flexible organic layer.

In a preferred embodiment of the present disclosure, the source and the drain respectively pass through the second via hole and the third via hole, and are connected with the active layer.

In a preferred embodiment of the present disclosure, the second via hole and the third via hole sequentially pass through the flexible organic layer, the interlayer insulating layer and the gate insulating layer.

The present invention also provides a manufacturing method for a flexible array substrate, including:

a step S20 of depositing a first metal layer on a gate insulating layer, and performing a first photomask process on the first metal layer using a first photomask to form a gate and a gate line of a thin film transistor on a surface of the gate insulating layer;

a step S30 of depositing an interlayer insulating layer on the first metal layer and forming at least two first via holes on the interlayer insulating layer;

a step S40 of depositing a flexible organic layer on the interlayer insulating layer, wherein filler material of the first via holes is same as material of the flexible organic layer;

a step S50 of depositing a second metal layer on the flexible organic layer and performing a second photomask process on the second metal layer using a second photomask to form a source and a drain on a surface of the flexible organic layer; and a step S60 of depositing a passivation layer on the second metal layer.

In a preferred embodiment of the present disclosure, the manufacturing method further includes a step S10 of providing a glass substrate, and sequentially depositing a flexible base substrate, a buffer layer, an active layer and the gate insulating layer.

In a preferred embodiment of the present disclosure, the step S40 includes:

a step S41 of depositing the flexible organic material on the interlayer insulating layer; and a step S42 of patterning the flexible organic material and retaining portions of the patterned flexible organic material near the first via holes to form the flexible organic layer.

In a preferred embodiment of the present disclosure, the step S50 includes:

a step S51 of depositing the second metal layer on the interlayer insulating layer;

a step S52 of coating a photoresist on the second metal layer;

a step S53 of etching the second metal layer to remove a portion of the second metal layer which is not coated by the photoresist, to form at least two sources, at least two drains, at least two second via holes corresponding to the sources, and at least two third via holes corresponding to the drain electrode, after the photoresist is exposed and developed;

wherein the sources and the drains are located on a same layer structure as the flexible organic layer; and a step S54 of removing the photoresist.

In a preferred embodiment of the present disclosure, the first via holes are continuous holes, the first via holes are formed between two adjacent thin film transistors, the first via holes sequentially pass through the interlayer insulating layer, the gate insulating layer and the buffer layer;

the source and the drain respectively passes through a second via hole and a third via hole, and are connected with an active layer; and the second via hole and the third via hole sequentially pass through the flexible organic layer, the interlayer insulating layer and the gate insulating layer.

The present disclosure also provides a flexible array substrate, including:

a glass substrate;

a flexible base substrate formed on a surface of the glass substrate;

a buffer layer formed on a surface of the flexible base substrate;

an active layer formed on a surface of the buffer layer;

a gate insulating layer formed on a surface of the active layer, and covering the active layer and the buffer layer;

a first metal layer formed on a surface of the gate insulating layer, and patterned to form a gate and a gate line of a thin film transistor;

an interlayer insulating layer formed on a surface of the first metal layer, and covering the first metal layer and the gate insulating layer;

a flexible organic layer formed on a surface of the interlayer insulating layer;

a second metal layer formed on a surface of the flexible organic layer, and patterned to form a source and a drain, wherein the source includes a second via hole, and the drain includes a third via hole; and a passivation layer formed on a surface of the second metal layer;

wherein the flexible array substrate further includes at least two first via holes, and filler material of the first via hole is same as material of the flexible organic layer, each of the first via holes is formed between two adjacent thin film transistors, and each of the first via holes sequentially passes through the interlayer insulating layer, the gate insulating layer and the buffer layer.

In a preferred embodiment of the present disclosure, the flexible organic layer is formed by patterning a flexible organic material deposited on a surface of the interlayer insulating layer, and retaining at least a portion of the patterned flexible organic material;

the source and the drain are formed by patterning a second metal layer deposited on a surface of the interlayer insulating layer, and retaining at least a portion of the patterned second metal layer; and the source and the drain are located on a same layer structure as the flexible organic layer.

In a preferred embodiment of the present disclosure, the source and the drain respectively pass through the second via hole and the third via hole, and are connected with the active layer.

In a preferred embodiment of the present disclosure, the second via hole and the third via hole sequentially pass through the flexible organic layer, the interlayer insulating layer and the gate insulating layer.

The advantages of the present disclosure are as follows: Compared with the prior art, in a flexible array substrate and a manufacturing method thereof provided in the present disclosure, continuous first via holes are disposed between adjacent thin film transistors, and flexible organic material is filled in the area of the first via hole as a support. The structure immediately diffuses stress to four sides when the flexible display apparatus is bent, and the adjacent thin film transistors do not influence each other. Moreover, the flexible organic material is used as a filling support material, making the entire layers more endurable against bending, thus ensuring display in a small radius of curvature.

BRIEF DESCRIPTION OF DRAWINGS

In order to more clearly illustrate the embodiments of the present disclosure or the technical solutions in prior arts, the following briefly introduces the accompanying drawings used in the embodiments. Obviously, the drawings in the following description merely show some of the embodiments of the present disclosure. As regards one of ordinary skill in the art, other drawings can be obtained in accordance with these accompanying drawings without making creative efforts.

DETAILED DESCRIPTION OF PREFERRED EMBODIMENTS

The following description of the embodiments with reference to the accompanying drawings is used to illustrate particular embodiments of the present disclosure. The directional terms referred in the present disclosure, such as "upper", "lower", "front", "back", "left", "right", "inner", "outer", "side surface", etc. are only directions with regard to the accompanying drawings. Therefore, the directional terms used for describing and illustrating the present disclosure are not intended to limit the present disclosure.

The present disclosure aims to the technical problem in a conventional flexible display apparatus that when a radius of curvature is sufficiently small, stress on an inorganic layer of the flexible display apparatus becomes greater and cannot be effectively released, thereby causing irreparable damage to the layer structure and affecting display of the flexible display apparatus. The present embodiments can solve this problem.

Figure 1:
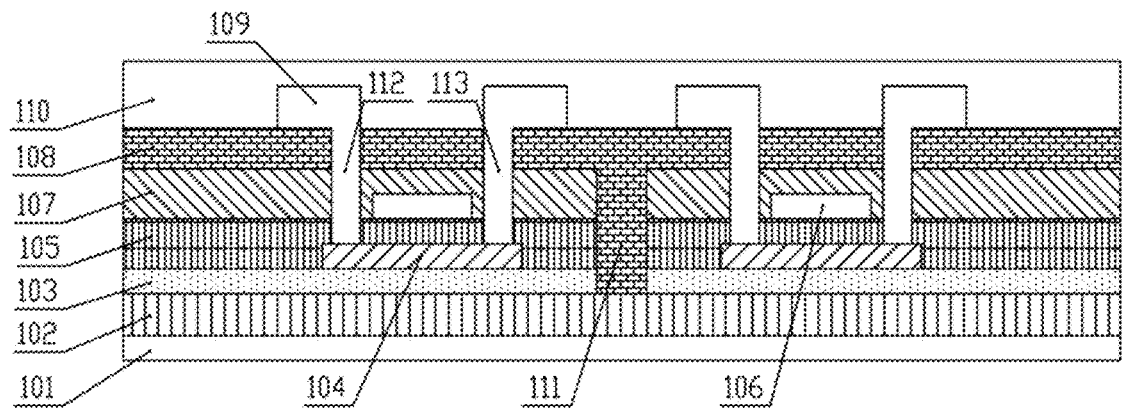
FIG. 1 is a layer structure diagram of a flexible array substrate in accordance with a first preferred embodiment of the present disclosure.

FIG. 1 is a layer structure diagram of a flexible array substrate in accordance with a first preferred embodiment of the present disclosure.

The flexible array substrate includes a glass substrate 101, a flexible base substrate 102, a buffer layer 103, an active layer 104, a gate insulating layer 105, a first metal layer 106, layer 107, a flexible organic layer 108, a second metal layer 109 and a passivation layer 110.

The flexible base substrate 102 is a polyimide film, and is formed on a surface of the glass substrate 101 as a base of a flexible display panel.

The polyimide film is the most preferred film insulating material, has a strong tensile strength, and is formed by pyromellitic dianhydride and diamine diphenylether in a highly polar solvent undergoing polycondensation, film casting and then imidization.

The buffer layer is disposed on a surface of the flexible base substrate 102, and the active layer 104 is disposed on a surface of the buffer layer 103.

The gate insulating layer 105 is disposed on a surface of the active layer 104 and completely covers the active layer 104 and the buffer layer 103. The gate insulating layer is deposited on the active layer 104 by a chemical method. In the present embodiment, material of the gate insulating layer is silicon nitride. Silicon oxide, silicon oxynitride and the like can also be used.

The first metal layer 106 is formed on a surface of the gate insulating layer 105, and the first metal layer 106 is patterned to form a gate and a gate line of a thin film transistor.

Preferably, the first metal layer 106 is deposited by a magnetron sputtering process.

In the embodiment, the first metal layer 106 may be made of metal such as molybdenum, aluminum, aluminum-nickel alloy, molybdenum-tungsten alloy, chromium, or copper. It is also possible to use a combination structure of the above-mentioned material layers.

The interlayer insulating layer 107 is disposed on a surface of the first metal layer 106 and covers the first metal layer 106 and the gate insulating layer 105 to insulate the first metal layer 106 from the second metal layer 109.

The flexible organic layer 108 is formed on a surface of the interlayer insulating layer 107. In addition, the flexible array substrate further includes at least two first via holes 111 sequentially passing through the interlayer insulating layer 107, the gate insulating layer 105 and the buffer layer 103.

Figure 2:
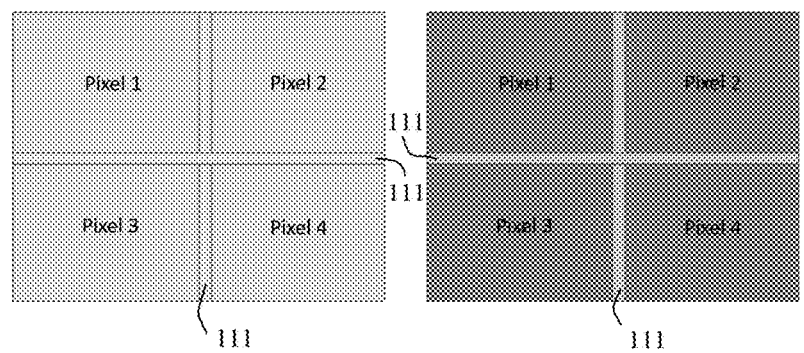
FIG. 2 is a top view A of a layer structure of a flexible array substrate in accordance with a preferred embodiment of the present disclosure.
Figure 3:
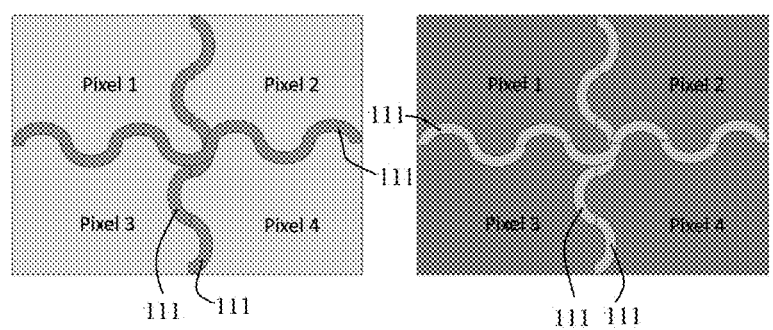
FIG. 3 is a top view B of a layer structure of a flexible array substrate in accordance with a preferred embodiment of the present disclosure.
Figure 4:
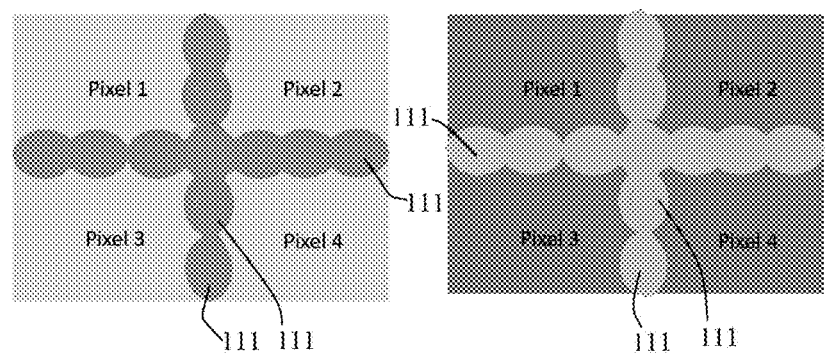
FIG. 4 is a top view C of a layer structure of a flexible array substrate in accordance with a preferred embodiment of the present disclosure.

The first via holes 111 are continuous holes, and the first via holes 111 are formed between two adjacent thin film transistors. The thin film transistor array is divided into a plurality of thin film transistors, and each of the thin film transistors is regarded as a unit. The first via holes 111 are continuously arranged between the units, and the first via holes 111 effectively surrounds each of the thin film transistor units and separates each of the thin film transistor units. The different first via holes 111 are shown in FIG. 2, FIG. 3, and FIG. 4.

Flexible organic material is filled in the area of the first via hole as a support. In addition, the structure immediately diffuses stress to four sides when the flexible display apparatus is bent, and the adjacent thin film transistors do not influence each other. The flexible organic material is used as a filling support material, making the entire layers more endurable against bending, thus ensuring display in a small radius of curvature.

Preferably, in the embodiment, the flexible organic material may be a flexible organic material, such as a polyimide resin, a siloxane or the like, wherein the thickness of the filled flexible organic layer 108 ranges from 0.5 μm to 3 μm.

The second metal layer 109 may be formed on a surface of the flexible organic layer 108 by a magnetron sputtering process, and the second metal layer 109 is patterned to form a source and a drain. The source includes a second via hole 112, and the drain includes a third via hole 113, wherein the second via hole 112 and the third via hole 113 sequentially pass through the flexible organic layer 108, the interlayer insulating layer 107, and the gate insulating layer 105.

In addition, the source and the drain respectively pass through the second via hole 112, and the third via hole 113, and are connected with the active layer 104.

The passivation layer 110 is formed on a surface of the second metal layer 109. Preferably, material of the passivation layer 110 is usually a silicon nitride compound.

Figure 5:
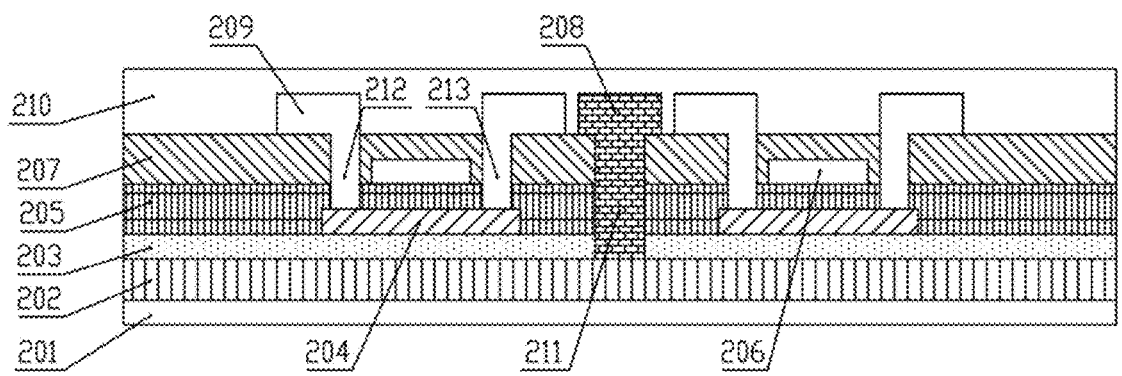
FIG. 5 is a layer structure diagram of a flexible array substrate in accordance with a second preferred embodiment of the present disclosure.

FIG. 5 is a layer structure diagram of a flexible array substrate in accordance with a second preferred embodiment of the present disclosure. The flexible array substrate includes a glass substrate 201, a flexible base substrate 202, a buffer layer 203, an active layer 204, a gate insulating layer 205, a first metal layer 206, layer 207, a flexible organic layer 208, a second metal layer 209 and a passivation layer 210.

The difference from the first embodiment is that the flexible organic layer 208 is formed on a surface of the interlayer insulating layer 207 by patterning a flexible organic material deposited on a surface of the interlayer insulating layer 207 and retaining at least a portion of the patterned flexible organic material.

The second metal layer 209 is formed on a surface of the interlayer insulating layer 207, and the second metal layer 209 is patterned to form a source and a drain. The source includes a second via hole 212, and the drain includes a third via hole 213. The second via hole 212 and the third via hole 213 sequentially pass through the interlayer insulating layer 207 and the gate insulating layer 205.

The source and the drain are located on a same film structure as the flexible organic layer 208.

The layer thickness of the first embodiment of the present disclosure is thicker than that of the second embodiment. However, the bending property of the first embodiment is stronger than that of the second embodiment, and the flexible array substrates can correspondingly be selected according to demands.

Therefore, a flexible array substrate of the preferred embodiment is obtained by disposing the continuous first via holes 211 between two adjacent thin film transistors and filling the first via holes 211 with the flexible organic material, so that the flexible display panel has strong bending endurance, ensuring display of the flexible display panel in a small radius of curvature.

Figure 6:
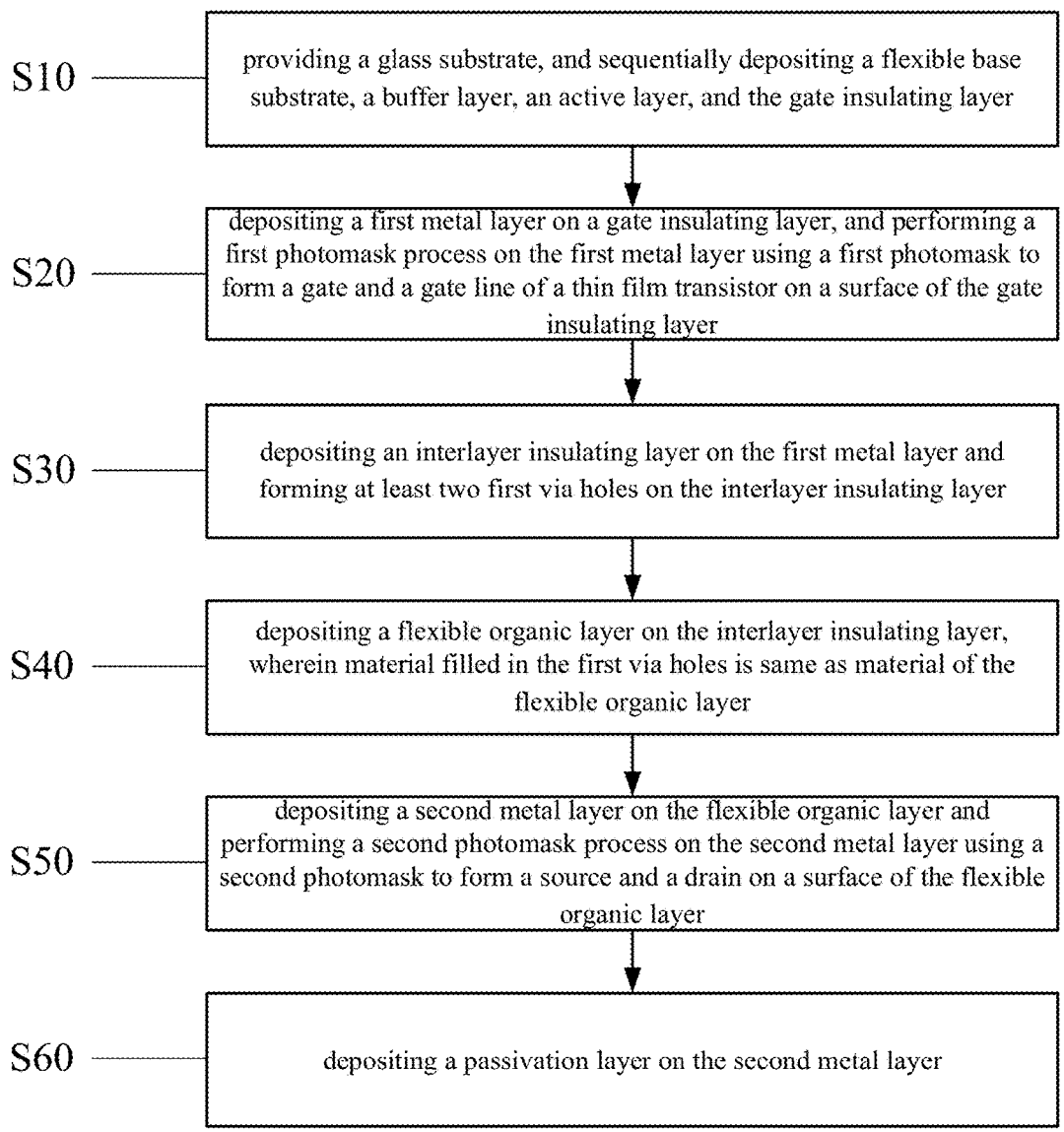
FIG. 6 is a flowchart of a manufacturing method for a flexible array substrate in accordance with a preferred embodiment of the present disclosure.
Figure 7:
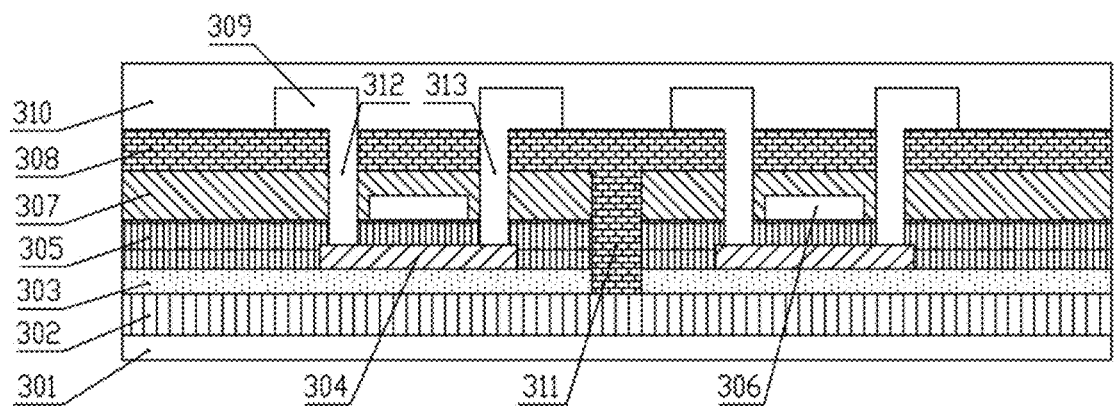
FIG. 7 is a final product diagram of a manufacturing method for a flexible array substrate in accordance with a third preferred embodiment of the present disclosure.

FIG. 6 is a flowchart of a manufacturing method for a flexible array substrate in accordance with a preferred embodiment of the present disclosure. FIG. 7 is a final product diagram of a manufacturing method for a flexible array substrate in accordance with a third preferred embodiment of the present disclosure. The method includes the following steps:

In step S10, a glass substrate is provided and a flexible base substrate 302, a buffer layer 303, an active layer 304, and the gate insulating layer 305 are sequentially deposited on the glass substrate.

The glass substrate is provided. First, a flexible base substrate 302, is a polyimide film, and is deposited on the glass substrate and formed on a surface of the glass substrate as a base of a flexible display panel.

The polyimide film is the most preferred film insulating material, has a strong tensile strength, and is formed by pyromellitic dianhydride and diamine diphenylether in a highly polar solvent undergoing polycondensation, film casting and then imidization.

Then, the buffer layer 303 and the active layer 304 are sequentially deposited on the flexible base substrate 302, wherein the active layer 304 is a metal oxide film.

Finally, the gate insulating layer is deposited on the active layer 304 by a chemical method. In the present embodiment, material of the gate insulating layer is silicon nitride. Silicon oxide, silicon oxynitride and the like can also be used. The gate insulating layer 105 is disposed on a surface of the active layer 304 and completely covers the active layer 304 and the buffer layer 303.

In step S20, a first metal layer 306 is deposited on the gate insulating layer 305, a first mask process is performed on the first metal layer using a first photomask to form a gate and a gate line of a thin film transistor on a surface of the gate insulating layer 305.

The first metal layer 306 is deposited on the gate insulating layer 305 by a magnetron sputtering process. The metal material may be molybdenum, aluminum, aluminum-nickel alloy, molybdenum-tungsten alloy, chromium, or copper. It is also possible to use a combination structure of the above-mentioned material layers.

Then, a photoresist is coated on the first metal layer 306, and a gate and a gate line of a thin film transistor are formed on the substrate by a patterning process, including steps of exposure, development, etching and removal.

In step S30, a layer insulating layer 307 is disposed on the first metal layer 306, and at least two first via holes 311 are formed on the interlayer insulating layer 307.

The interlayer insulating layer 307 is disposed on a surface of the first metal layer 306 and covers the first metal layer 306 and the gate insulating layer 305 to insulate the first metal layer 306 from the second metal layer 309.

The continuous first via holes 311 are formed on the interlayer insulating layer 307 using an etching process, wherein the first via holes 311 sequentially pass through the interlayer insulating layer 307, the gate insulating layer 305 and the buffer layer 303.

The first via holes 311 are continuous holes, and the first via holes 311 are formed between two adjacent thin film transistors. The thin film transistor array is divided into a plurality of thin film transistors, and each of the thin film transistors is regarded as a unit. The first via holes 111 are continuously arranged between the units, and the first via holes 311 effectively surrounds each of the thin film transistor units and separates each of the thin film transistor units. The different first via holes 311 are shown in FIG. 2, FIG. 3 and FIG. 4.

In step S40, the flexible organic layer 308 deposited on the interlayer insulating layer 307, wherein filler material of the first via holes 311 is same as the flexible organic layer 308.

The flexible organic layer 308 is deposited on the interlayer insulating layer 307 and filled the first via holes 311. Flexible organic material is filled in the area of the first via holes 311 as a support. In addition, the structure immediately diffuses stress to four sides i when the flexible display apparatus is bent, and the adjacent thin film transistors do not influence each other. The flexible organic material is used as a filling support material, making the entire layers more endurable against bending, thus ensuring display in a small radius of curvature.

Preferably, in the embodiment, the flexible organic material may be a flexible organic material, such as a polyimide resin, a siloxane or the like, wherein the thickness of the filled flexible organic layer 108 ranges from 0.5 μm to 3 μm.

Figure 8:
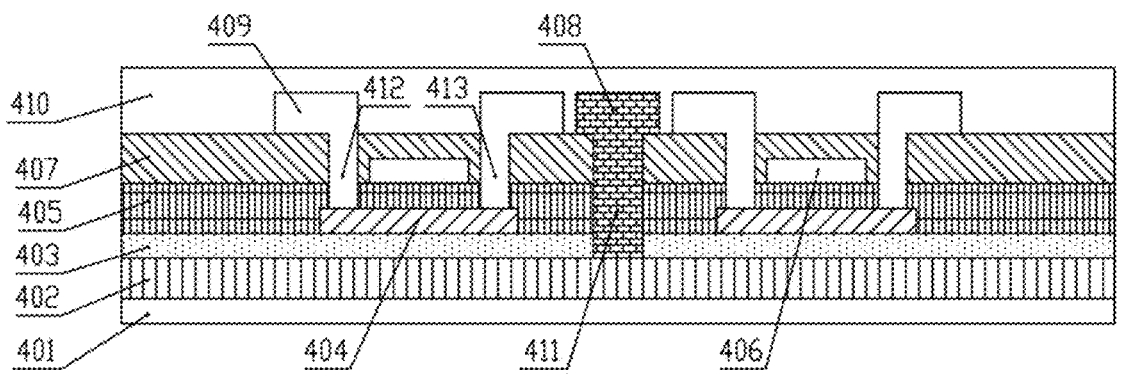
FIG. 8 is a final product diagram of a manufacturing method for a flexible array substrate in accordance with a fourth preferred embodiment of the present disclosure.

FIG. 8 is a final product diagram of a manufacturing method for a flexible array substrate in accordance with a fourth preferred embodiment of the present disclosure. After the flexible organic material is filled in the interlayer insulating layer 407, the flexible organic material is patterned, and portions of the patterned flexible organic material near the first via holes 411 are retained to form the flexible organic layer 408.

It can be seen from the layer structure that the layer thickness of the third embodiment of the present invention is thicker than that of the fourth embodiment. However, the bending property of the third embodiment is stronger than that of the fourth embodiment. The third embodiment is suitable for great bending curvature. The flexible display panel of Embodiment 4 is light and thin. The flexible array substrates can correspondingly be selected according to demands.

In step S50, a second metal layer 309 is deposited on the flexible organic layer 308, and a second mask process is performed on the second metal layer using a second photomask to form a source and a drain on a surface of the flexible organic layer 308.

In the third embodiment, the second metal layer 309 may be formed on a surface of the flexible organic layer 308 by a magnetron sputtering process, and the second metal layer 309 is patterned to form a source and a drain. The source includes a second via hole 312, and the drain includes a third via hole 313, wherein the second via hole 312 and the third via hole 113 sequentially pass through the flexible organic layer 308, the interlayer insulating layer 307 and the gate insulating layer 305.

In addition, the source and the drain respectively pass through the second via hole 312, and the third via hole 313, and are connected with the active layer 304.

The second metal layer 409 is formed on a surface of the interlayer insulating layer 407, and the second metal layer 409 is patterned to form a source and a drain. The source includes a second via hole 412, and the drain includes a third via hole 413. The second via hole 412 and the third via hole 413 sequentially pass through the interlayer insulating layer 407 and the gate insulating layer 405.

The source and the drain are located on a same film structure as the flexible organic layer 408.

In step S60, the passivation layer is deposited on the second metal layer.

The passivation layer 310 is formed on a surface of the second metal layer 309. Preferably, material of the passivation layer 310 is usually a silicon nitride compound.

A flexible array substrate of the preferred embodiment is obtained by disposing the continuous first via holes between two adjacent thin film transistors and filling the first via holes with the flexible organic material, so that the flexible display panel has strong bending endurance, ensuring display of the flexible display panel in a small radius of curvature.

The disclosure provides a flexible array substrate and a manufacturing method thereof. The array substrate comprises a glass substrate, a flexible base substrate, a buffer layer, an active layer, a gate insulating layer, a first metal layer, an interlayer insulating layer, a flexible organic layer, a second metal layer and passivation layer. By disposing the continuous first via holes between two adjacent thin film transistors and filling the first via holes with the flexible organic material, the flexible display panel has strong bending endurance, ensuring display of the flexible display panel in a small radius of curvature.

In summary, although the preferable embodiments of the present invention have been disclosed above, the embodiments are not intended to limit the present disclosure. A person of ordinary skill in the art, without departing from the spirit and scope of the present disclosure, can make various modifications and variations. Therefore, the scope of the disclosure is defined in the claims.

What is claimed is:

1. A flexible array substrate, comprising:
    a glass substrate;
    a flexible base substrate formed on a surface of the glass substrate;
    a buffer layer formed on a surface of the flexible base substrate;
    an active layer formed on a surface of the buffer layer;
    a gate insulating layer formed on a surface of the active layer, and covering the active layer and the buffer layer;
    a first metal layer formed on a surface of the gate insulating layer, and patterned to form a gate and a gate line of a thin film transistor;
    an interlayer insulating layer formed on a surface of the first metal layer, and covering the first metal layer and the gate insulating layer;
    a flexible organic layer formed on a surface of the interlayer insulating layer;
    a second metal layer formed on a surface of the flexible organic layer, and patterned to form a source and a drain, wherein the source includes a second via hole, and the drain includes a third via hole; and
    a passivation layer formed on a surface of the second metal layer;
    wherein the flexible array substrate further includes at least two first via holes, and filler material of the first via holes is same as material of the flexible organic layer.

2. The flexible array substrate as claimed in claim 1, wherein
    the flexible organic layer is formed by patterning a flexible organic material deposited on a surface of the interlayer insulating layer, and retaining at least a portion of the patterned flexible organic material;
    the source and the drain are formed by patterning a second metal layer deposited on a surface of the interlayer insulating layer, and retaining at least a portion of the patterned second metal layer; and
    the source and the drain are located on a same layer structure as the flexible organic layer.

3. The flexible array substrate as claimed in claim 1, wherein the source and the drain respectively pass through the second via hole and the third via hole, and are connected with the active layer.

4. The flexible array substrate as claimed in claim 1, wherein the second via hole and the third via hole sequentially pass through the flexible organic layer, the interlayer insulating layer and the gate insulating layer.

5. A manufacturing method for a flexible array substrate, comprising:
    a step S20 of depositing a first metal layer on a gate insulating layer, and performing a first photomask process on the first metal layer using a first photomask to form a gate and a gate line of a thin film transistor on a surface of the gate insulating layer;
    a step S30 of depositing an interlayer insulating layer on the first metal layer and forming at least two first via holes on the interlayer insulating layer;
    a step S40 of depositing a flexible organic layer on the interlayer insulating layer, wherein filler material of the first via holes is same as material of the flexible organic layer;
    a step S50 of depositing a second metal layer on the flexible organic layer and performing a second photomask process on the second metal layer using a second photomask to form a source and a drain on a surface of the flexible organic layer; and
    a step S60 of depositing a passivation layer on the second metal layer.

6. The manufacturing method as claimed in claim 5, comprising:
    a step S10 of providing a glass substrate, and sequentially depositing a flexible base substrate, a buffer layer, an active layer and the gate insulating layer.

7. The manufacturing method as claimed in claim 5, wherein the step S40 comprises:
    a step S41 of depositing the flexible organic material on the interlayer insulating layer; and
    a step S42 of patterning the flexible organic material and retaining portions of the patterned flexible organic material near the first via holes to form the flexible organic layer.

8. The manufacturing method as claimed in claim 5, wherein the step S50 comprises:
    a step S51 of depositing the second metal layer on the interlayer insulating layer;
    a step S52 of coating a photoresist on the second metal layer;
    a step S53 of etching the second metal layer to remove a portion of the second metal layer which is not coated by the photoresist, to form at least two sources, at least two drains, at least two second via holes corresponding to the sources, and at least two third via holes corresponding to the drain electrode, after the photoresist is exposed and developed;
    wherein the sources and the drains are located on a same layer structure as the flexible organic layer; and
    a step S54 of removing the photoresist.

9. The manufacturing method as claimed in claim 5, wherein
    the first via holes are continuous holes,
    the first via holes are formed between two adjacent thin film transistors, the first via holes sequentially pass through the interlayer insulating layer, the gate insulating layer and the buffer layer;

the source and the drain respectively passes through a second via hole and a third via hole, and are connected with an active layer; and the second via hole and the third via hole sequentially pass through the flexible organic layer, the interlayer insulating layer and the gate insulating layer.

10. A flexible array substrate, comprising:

a glass substrate;

a flexible base substrate formed on a surface of the glass substrate;

a buffer layer formed on a surface of the flexible base substrate;

an active layer formed on a surface of the buffer layer;

a gate insulating layer formed on a surface of the active layer, and covering the active layer and the buffer layer;

a first metal layer formed on a surface of the gate insulating layer, and patterned to form a gate and a gate line of a thin film transistor;

an interlayer insulating layer formed on a surface of the first metal layer, and covering the first metal layer and the gate insulating layer;

a flexible organic layer formed on a surface of the interlayer insulating layer;

a second metal layer formed on a surface of the flexible organic layer, and patterned to form a source and a drain, wherein the source includes a second via hole, and the drain includes a third via hole; and a passivation layer formed on a surface of the second metal layer;

wherein the flexible array substrate further includes at least two first via holes, and filler material of the first via hole is same as material of the flexible organic layer, each of the first via holes is formed between two adjacent thin film transistors, and each of the first via holes sequentially passes through the interlayer insulating layer, the gate insulating layer and the buffer layer.

11. The flexible array substrate as claimed in claim 10, wherein the flexible organic layer is formed by patterning a flexible organic material deposited on a surface of the interlayer insulating layer, and retaining at least a portion of the patterned flexible organic material;

the source and the drain are formed by patterning a second metal layer deposited on a surface of the interlayer insulating layer, and retaining at least a portion of the patterned second metal layer; and the source and the drain are located on a same layer structure as the flexible organic layer.

12. The flexible array substrate as claimed in claim 10, wherein the source and the drain respectively pass through the second via hole and the third via hole, and are connected with the active layer.

13. The flexible array substrate as claimed in claim 10, wherein the second via hole and the third via hole sequentially pass through the flexible organic layer, the interlayer insulating layer and the gate insulating layer.

* * * * *